United States Patent
Finarov et al.

(10) Patent No.: US 6,801,315 B2
(45) Date of Patent: Oct. 5, 2004

(54) METHOD AND SYSTEM FOR OVERLAY MEASUREMENT

(75) Inventors: Moshe Finarov, Rehovot (IL); David Scheiner, Ganei Yehuda (IL)

(73) Assignee: Nova Measuring Instruments Ltd., Rehovot (IL)

( * ) Notice: Subject to any disclaimer, the term of this patent is extended or adjusted under 35 U.S.C. 154(b) by 159 days.

(21) Appl. No.: 10/303,052

(22) Filed: Nov. 25, 2002

(65) Prior Publication Data

US 2003/0169423 A1 Sep. 11, 2003

(30) Foreign Application Priority Data

Mar. 7, 2002 (IL) .................................................. 148566

(51) Int. Cl.$^7$ .............................................. G01B 11/27
(52) U.S. Cl. ...................................... 356/401; 356/400
(58) Field of Search ................................ 356/400–401; 430/5, 22, 30

(56) References Cited

U.S. PATENT DOCUMENTS

| | | | |
|---|---|---|---|
| 4,595,295 A | * | 6/1986 | Wilczynski ................. 356/401 |
| 5,438,413 A | | 8/1995 | Mazor et al. |
| 5,604,344 A | | 2/1997 | Finarov |
| 5,610,718 A | | 3/1997 | Sentoku et al. |
| 6,166,801 A | | 12/2000 | Dishon et al. |

FOREIGN PATENT DOCUMENTS

| | | |
|---|---|---|
| EP | 0 818 814 A2 | 1/1998 |
| EP | 0 999 475 A2 | 5/2000 |

* cited by examiner

*Primary Examiner*—Zandra V. Smith
(74) *Attorney, Agent, or Firm*—Browdy and Neimark, P.L.L.C.

(57) ABSTRACT

An optical measurement method and system are presented for imaging two target structures in two parallel layers, respectively, of a sample, to enable determination of a registration between the two target structures along two mutually perpendicular axes of the layer. The sample is illuminated with incident radiation to produce a radiation response of the sample. The radiation response is collected by an objective lens arrangement, and the collected radiation response is split into two spatially separated radiation components. The split radiation components are directed towards at least one imaging plane along different optical channels characterized by optical paths of different lengths, respectively. The two split radiation components are detected in said at least one imaging plane, and two image parts are thereby acquired, each image part containing images of the two target structures. This enables determination of the relative distance between the two target structures.

43 Claims, 8 Drawing Sheets

FIG. 7

METHOD AND SYSTEM FOR OVERLAY MEASUREMENT

FIELD OF THE INVENTION

This invention is generally in the field of manufacturing multi-layer structures, such as semiconductor devices and integrated circuits, and relates to an optical measuring method and system for overlay measurements used to control the layer alignment in photolithography processing.

BACKGROUND OF THE INVENTION

Integrated circuits are multi-layer structures produced by applying a sequence of deposition-lithography-etching steps to a semiconductor wafer. In such structures, layers have to be precisely aligned with each other. The layer alignment is typically controlled by the so-called "overlay measurement", which is usually accomplished using a box-in-box (BIB) technique consisting of the following. A rectangular frame-like structure (target) is formed in a test site of each layer, and two locally adjacent layers (typically spaced by a dielectric layer) are considered as being correctly aligned if a specific alignment between the targets in the test sites is provided. Overlay defining the alignment is measured by comparing shifts between the targets along two mutually perpendicular axes, i.e., determining whether the targets are precisely concentric, the smaller target being inside the larger one (in projection along a vertical axis).

U.S. Pat. No. 5,438,413 discloses the use of a "stand-alone" apparatus for measuring overlay registration. This technique is employed for example in the "stand-alone" machine model KLA-5200 commercially available from KLA-Tencor. Such a stand-alone apparatus utilizes an interferometric microscope with a large numerical aperture operable to acquire a series of interference images at different vertical planes relative to the surface of a sample under investigation. Measured data in these planes is used for calculating the magnitude and phase of mutual coherence between the object and reference waves for each pixel in the image, thereby forming synthetic images. The brightness of this image is proportional to either the complex magnitude or the phase of the mutual coherence. The differences between synthetic images relating to the target position are then used as a means for detecting the overlay misalignment. The technique is characterized by a small depth of focus. Therefore, in most practical cases, two separate in-focus images of the two layers, respectively, are required. This unavoidably requires relative displacement between a focusing lens and a sample along the optical axis of the lens. This procedure is very sensitive to vibrations, since a very small lateral shift between the two images caused by the vibrations would be recorded as a misalignment between the layers. Therefore, such a system requires the use of a comprehensive vibration isolation platform, and accordingly is practically impossible to use as an integrated measurement system, which has to be of a small size and has to be stable to a high vibration level during measurement caused by a processing tools arrangement.

U.S. Pat. No. 6,166,801 assigned to the assignee of the present invention, discloses another technique of the kind specified, according to which an integrated measurement system is used operating with a relatively small numerical aperture, and consequently a larger depth of focus, as compared to the above-described technique of U.S. Pat. No. 5,438,413. Here, the focal plane of the objective is brought to a position at one of the two locally adjacent layers under measurement or at a location between the two measured layers. This technique allows for capturing a common image of both targets in two locally adjacent layers, respectively, wherein each frame is located at a specific position with respect to the focal plane of the objective. The technique, while being sufficiently good for the structures where the layers are spaced from each other a distance up to 1 $\mu$m, appears to be less effective when this distance exceeds 1 $\mu$m, since in this case aberrations of an optical system (e.g., coma, chromatic and astigmatic aberrations) become more significant and affect the measurement accuracy.

SUMMARY OF THE INVENTION

There is accordingly a need in the art to facilitate controlling layer alignment by providing a novel method and system for optical overlay measurement.

The present invention utilizes the acquisition of two images of two target structures in two layers, of a sample in a single measurement, at the same location of the focal plane of an objective relative to the sample. This is implemented by designing and operating the measurement system such that the two targets are imaged on either a common or different imaging planes, the imaging plane being a conjugate plane with respect to each of the two layers, respectively, providing the best image quality for each of the respective targets. To achieve this, light components coming from the two targets and collected by the common objective lens are directed towards the imaging plane(s) along two different optical paths, respectively.

There is thus provided according to one aspect of the present invention, a method for imaging two target structures in two parallel layers, respectively, of a sample, the method enabling determination of a registration between the two target structures along two mutually perpendicular axes of the layer, the method comprising:

(a) illuminating the sample with incident radiation to produce a radiation response of the sample to said incident radiation;

(b) collecting the radiation response by an objective lens arrangement;

(c) splitting the collected radiation response into two spatially separated radiation components and directing the split radiation components towards at least one imaging plane along different optical channels characterized by optical paths of different lengths, respectively;

(d) detecting said two split radiation components in said at least one imaging plane, thereby concurrently acquiring two image parts, each containing images of the two target structures, and enabling determination of the relative distance between the two target structures.

The term "radiation response" used herein signifies at least one of the following: reflection of the incident radiation, scattering of the incident radiation, radiation excited by the incident radiation (e.g., luminescence or fluorescence).

The different optical paths may be predetermined by carrying out a calibration procedure and/or based on knowledge about the sample's structure (recipe), and/or may be adjustable in accordance with the quality of the image being acquired. Preferably, the best image quality is considered as that characterized by the optimal image contrast and/or optimal image resolution. The splitting of the collected radiation response may utilize a regular beam splitter (typically, a partially transparent mirror), a polarized-based beam splitter, or a notch- or wavelength-selective splitter.

According to one embodiment, the two images are captured by a common pixel-array detector (e.g., CCD camera), i.e., in the common imaging plane. In this case, the images can be acquired in different regions of the sensing surface of the detector, or within the same sensing region of the detector. According to another embodiment, two pixel-array detectors are used for acquiring the two images of two target structures, respectively, i.e., two different imaging planes.

According to another aspect of the present invention, there is provided an optical measurement system for imaging two target structures in two different layers, respectively, of a sample, the system comprising:

an illumination device operable to produce incident radiation for illuminating the sample and thereby producing radiation response of the sample to the incident radiation;

an objective lens arrangement accommodated so as to collect the radiation response;

a detection system comprising at least one pixel-array detector defining at least one imaging plane;

a radiation directing assembly accommodated in the path of the collected radiation response and operable to split the collected radiation response into two spatially separated radiation components and direct the separated radiation components to said at least one imaging plane along two different optical channels characterized by optical paths of different lengths, respectively, thereby enabling to concurrently acquire on said at least one imaging plane two image parts, each comprising images of the two target structures.

More specifically, the present invention is used for overlay measurements for controlling a photolithography process applied to a semiconductor wafer, and the operational principles of the technique of the present invention allow for designing an integrated measurement system. Such a system is intended for measurements in samples (e.g., wafers) progressing on a production line, and is therefore designed to be installed within a processing machine outside the processing area.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 1:
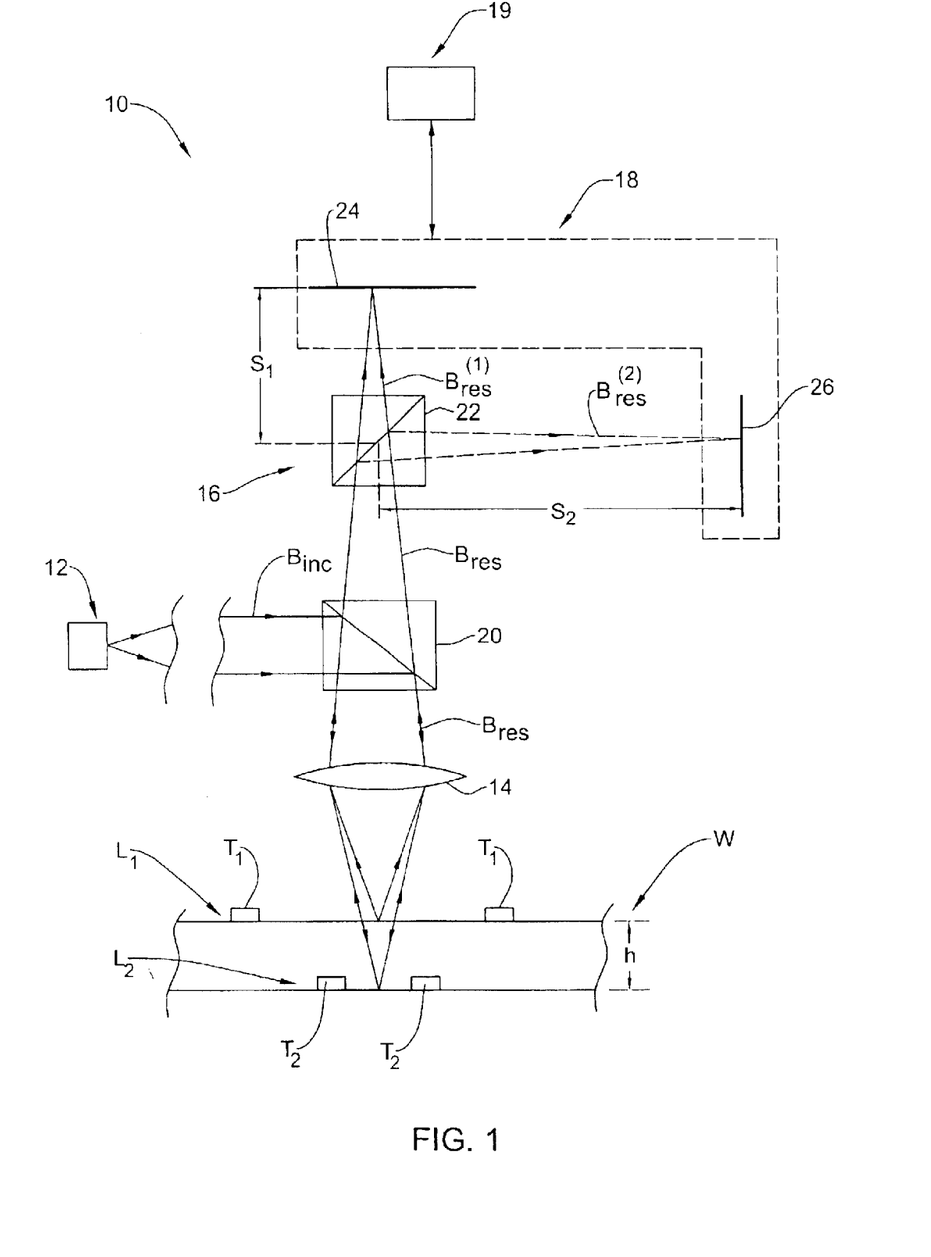
FIG. 1 is a schematic illustration of a measurement system according to one example of the invention.

Referring to FIG. 1, there is exemplified a system 10 according to the invention for overlay measurement in a multi-layer sample (wafer) W. A beam propagation scheme through the system 10 is shown here schematically to facilitate illustration of the main principles of the invention. The sample W has two spaced-apart layers $L_1$ and $L_2$ (spaced from each other a distance h along the Z-axis) bearing alignment marks $T_1$ and $T_2$ (constituting target structures) of a geometry enabling overlay measurements. In the present example, the marks are in the form of rectangular frames. Practically, the alignment marks are located within test sites of the wafer.

The system 10 comprises such main constructional parts as an illumination device 12, an objective lens arrangement 14 (generally, formed of one or more lenses, such as objective and tube lenses), a radiation directing assembly 16, and a detection system 18. The output of the detection system is connectable to a control unit 19 that operates the system parts and processes and analyses output data of the detection system. The illumination device 12 produces incident radiation $B_{inc}$. In the present example of FIG. 1, the detection system 18 includes two pixel-array detectors (e.g., CCDs) 24 and 26 each defining an imaging plane, which is a conjugate plane to that of the respective object (target) plane: the detector 24 is located in the conjugate plane to the layer $L_1$, and the detector 26 is located in the conjugate plane to the layer $L_2$. In the present example, the same objective lens arrangement 14 is used for focusing incident radiation $B_{inc}$ onto the sample and collecting radiation response $B_{res}$ coming from the sample W, and the radiation response is formed by radiation returned back from the sample. Accordingly, the system 10 comprises a beam splitter 20 that spatially separates between the incident and returned radiation.

It should be understood that, generally, the use of the imaging objective lens 14 for focusing the incident radiation, as well as the use of the beam splitter 20, is optional for the purposes of the present invention. Preferably, however, the common objective lens 14 is used for illuminating and imaging purposes. This configuration makes the system compact, which is important for integrated measurement tools and provides for auto-focusing as will be described further below.

The radiation directing assembly 16 includes a beam splitter 22, which splits the collected radiation $B_{res}$ into two spatially separated radiation components $B^{(1)}_{res}$ and $B^{(2)}_{res}$ and directs these components to the detectors 24 and 26 along two different paths $S_1$ and $S_2$ of different lengths, respectively. The beam splitter 22 may be of the kind having a partially transparent surface, such that it transmits one part of radiation impinging thereon and reflects the other part, or may have a polarization splitting surface that transmits one linear polarization and reflects the other. It should be noted that such a beam splitter may be of the kind having a notch- or wavelength-selective structure. The difference between these paths is defined by the distance between the responding layers $L_1$ and $L_2$ of the sample and by the optical parameters of the objective lens arrangement:

$$S_2 \approx S_1 + M^2 \cdot h$$

wherein M is the optical magnification.

For example, when the layers are spaced from each other a distance of 1 μm and the magnification factor is equal to 70, we have: $S_2-S_1 \approx 5$ mm.

It should be understood that when using two detectors, they should be properly synchronized in order to acquire images at the same time. It should also be noted that the length of the optical path $S_2$ is preferably adjustable in order to adjust the system to the specific distance h between the layers. In this case, the detector 26 is mounted for a reciprocating movement along the optical axis of propagation of the light response beam $B_{res}$, and is therefore associated with a suitable controllable drive unit (not shown).

Figures 2A, 2B, 2C:
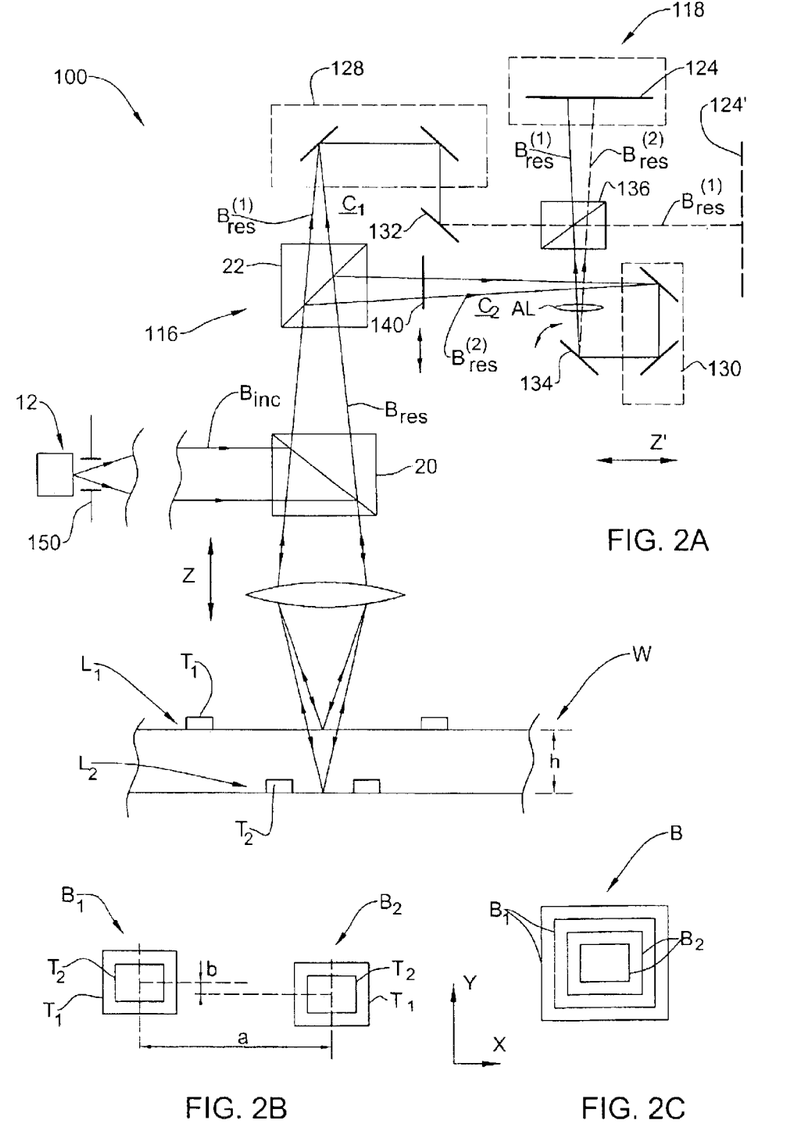
FIGS. 2A and 2B illustrate a measurement systems according to another example of the invention.
FIG. 2C exemplifies the use of a smaller field of view detector in the system of FIGS. 2A–2B.

Reference is now made to FIGS. 2A and 2B illustrating another example of the invention. FIG. 2A shows a measurement system 100 of a somewhat different design as compared to the previously described system 10. The same reference numbers are used for identifying those components that are common in the systems 10 and 100. In the system 100, in distinction to system 10, a detection system 118 includes a single pixel-array detector 124, and a radiation directing assembly 116 is composed of the beam splitter 22, retro-reflectors 128 and 130, mirrors 132 and 134, and a beam combiner 136. The beam splitter 22 separates the collected radiation into two radiation components $B^{(1)}_{res}$ and $B^{(2)}_{res}$ and directs them towards two different channels $C_1$ and $C_2$ defining two different optical paths between the beam splitter 22 and an imaging plane defined by the sensing surface of the detector 124. It should be understood that the beam combiner 136, similar to the beam splitter 22, may be of the kind having a partially transparent surface, such that it transmits one part of radiation impinging thereon and reflects the other part, or may have a polarization splitting surface that transmits one linear polarization and reflects the other, thereby preventing typical energy losses associated with the use of the partially transparent beam splitter.

Thus, the collected radiation component $B^{(1)}_{res}$ is transmitted by the beam splitter to propagate along the channel $C_1$, where this radiation component impinges onto the retro-reflector 128, which reflects it to the mirror 132, and the latter reflects the radiation component $B^{(1)}_{res}$ towards the beam combiner 136. The other radiation component $B^{(2)}_{res}$, is reflected by the beam splitter 22 and propagates towards the channel $C_2$, where it passes through the retro-reflector 130, which reflects it to the mirror 134 that, in turn, reflects the radiation $B^{(2)}_{res}$ towards the beam combiner 136. The latter combines the radiation components $B^{(1)}_{res}$ and $B^{(2)}_{res}$ and allows their propagation towards the imaging detector 124.

The system configuration of FIG. 2A allows for aligning the two images formed by radiation components $B^{(1)}_{res}$ and $B^{(2)}_{res}$, respectively, with respect to each other in the imaging plane. To this end, the mirror 134 may be mounted for pivotal or lateral movement to direct the radiation component $B^{(2)}_{res}$ to a location in the imaging plane spaced-apart from that of the other radiation component. This results in two images obtained at different regions of the detector and formed by radiation components of the two channels $C_1$ and $C_2$, respectively.

As shown in FIG. 2B, two such box-in-box images $B_1$ and $B_2$ are obtained in the imaging plane. Each of these images includes images of both targets $T_1$ and $T_2$, while one image $B_1$ corresponds to the imaging plane being conjugate to the target $T_1$, and the other image $B_2$ corresponds to the imaging plane being conjugate to the target $T_2$. Distances a and b between the two box-in-box images $B_1$ and $B_2$ are certain parameters of the system 100 (along X- and Y-axes), which are taken into account when controlling the layers alignment. In order to prevent interference between the light components forming the two images $B_1$ and $B_2$ in the same image plane, a field stop 150 is preferably used in the illumination channel, at the output of the illumination device 12.

It should be noted that, in the case the field of view of the detector 124 is insufficient to obtain two spaced-apart images on the detector plane, the split light components of the collected radiation response propagating through the channels $C_1$ and $C_2$ are directed onto the same sensing region of the detector. This is exemplified in FIG. 2C presenting a "combined" image B obtainable by the smaller field of view detector 124. In order to enable identification of the image parts $B_1$ and $B_2$ in the combined image B, the image parts should be differently magnified, resulting in two concentric image parts. Turning back to FIG. 2A, this can be achieved by using an additional lens AL located in the path of the radiation reflected from the mirror 134 towards the beam combiner 136. The lens AL appropriately magnifies or de-magnifies the image obtained with the radiation component of the channel $C_2$. For example, if the image parts $B_1$ and $B_2$ have about 20 μm and 30 μm, respectively, in the same dimension, additional optical magnification is needed: 30/20=1.33×. Since the optical power is low, and the lens AL is located in the low numerical aperture conjugate path, this lens may be simple and practically unaffecting the image quality.

As also shown in FIG. 2A, the similar configuration can be used with two detectors, the second detector 124' being shown in the figure in dashed lines. In this case, the use of the beam combiner 136 is eliminated.

Further provided in the system 100 of FIG. 2A is a shutter 140 accommodated in the optical path of the radiation component $B^{(2)}_{res}$ emerging from the beam splitter 22. The provision of the shutter 140 is optional and is associated with the following: In order to carry out a pattern recognition and/or auto-focusing procedure, using the radiation response component propagating through one channel only, the other channel may be switched off by shifting the shutter 140 into its operative position.

Figure 2D:
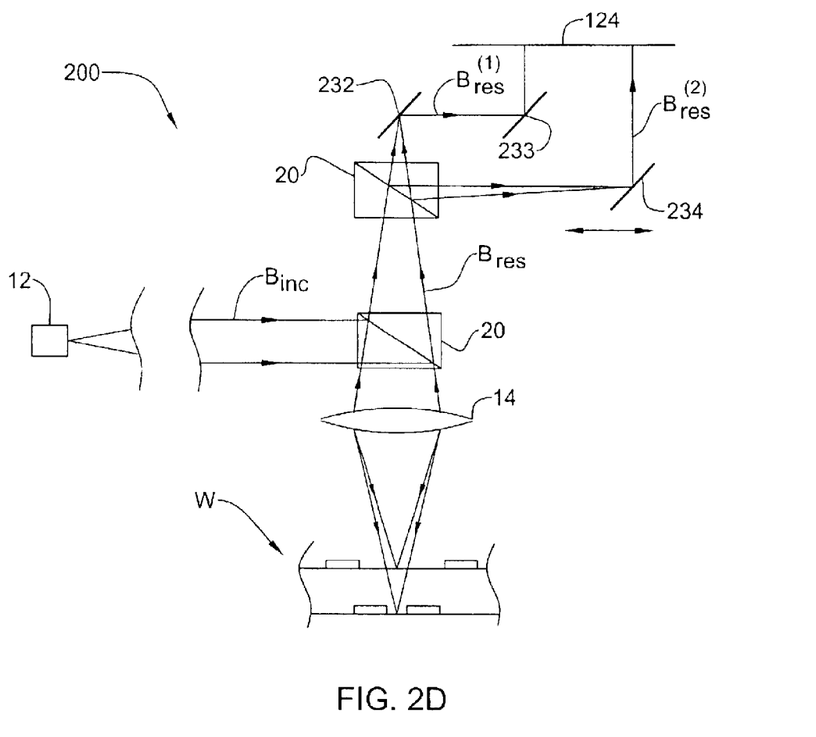
FIG. 2D schematically illustrates a measurement system according to yet another example of the invention.

FIG. 2D illustrates a measurement system 200 according to yet another example of the invention that does not require the beam combiner. Similarly, the same reference numbers identify components that are common in all the examples (with no retro-reflectors shown). In the system 200, two mirrors 232 and 233, and a mirror 234 are accommodated in the two optical paths of two split radiation components, respectively, of the collected radiation response. Thus, the radiation component $B^{(1)}_{res}$ is transmitted by the beam splitter 22 towards the mirror 232, which reflects it to the mirror 233, which, in turn reflects the radiation component $B^{(1)}_{res}$ to the imaging plane (detector 124). The radiation component $B^{(2)}_{res}$ is reflected by the beam splitter 22 to the mirror 234, which reflects it towards the imaging plane. The mirror 234 is mounted for reciprocating movement for adjusting its position to thereby direct the radiation component $B^{(2)}_{res}$ to an appropriate region of the detector.

It should be understood that, for the cases of FIGS. 2B, 2C and 2D, any separation between two image parts $B_1$ and $B_2$ is followed by a proper calibration in order to calculate accurate position displacement of one image part with respect to the other. This calibration may be carried out by using a calibration target made of high contrast materials, such as chrome on glass, in which both outer and inner lines are in the same plane. Such a calibration target may for example be that commercially available from VLSI Standards. The preferred calibration procedure will be described more specifically further below.

Figure 2E:
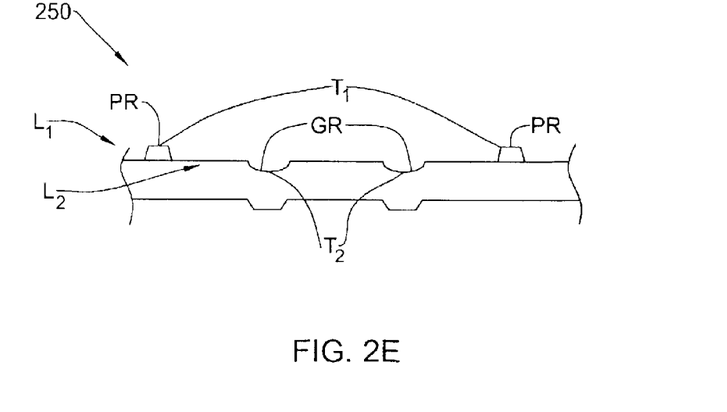
FIGS. 2E and 2F illustrate yet another example of the invention.
Figure 2F:
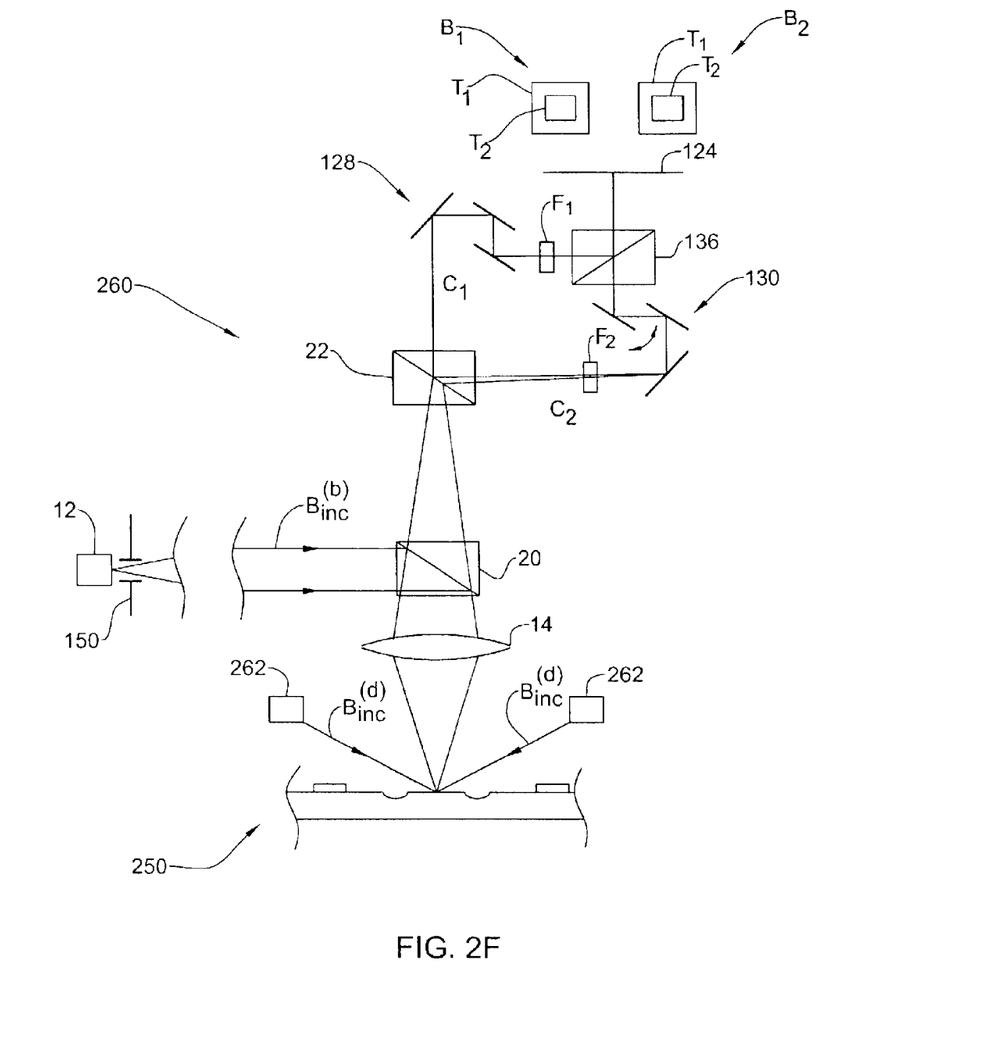

Reference is now made to FIGS. 2E and 2F illustrating yet another example of the invention. FIG. 2E exemplifies a layer structure under measurement in the form of a photoresist-on-metal structure 250. The upper layer $L_1$ has a target structure $T_1$ formed by photoresist lines PR (or frame), and the lower metal layer $L_2$ has a target structure $T_2$ formed by small pits (or grooves) GR. Such topology of the metal layer $L_2$ may be the result of the pattern (small recesses) in an underneath dielectric layer $L_3$: the recesses in the layer $L_3$ are repeated in the layer $L_2$ but with more gradual edges. Overlay measurement in such a wafer are difficult to implement with the standard bright field illumination. Indeed, since the edges are gradual and the depth of the recess is small, optical contrast of these lines relative to the surrounding metal in the bright field image would be very low.

It is known to enhance the contrast of features caused by topographic effects by using the dark field illumination, due to strong scattering of incident light on the edges. In this case, the image contrast is high, because the surrounding metal surface is highly reflective and is completely dark when using the dark field illumination. In a dark field image, the bright edges appear on a very dark background (metal surrounding). However, the optical contrast of the photoresist lines might be worse in an image acquired with the dark illumination than that of the bright illumination. This may result in such undesirable effects as interference fringes, etc.

The present invention solves this problem by imaging the photoresist target structure with the bright illumination, and imaging the metal grooves' target structure with the dark illumination. FIG. 2F exemplifies a measurement system 260 according to the invention for measuring in the above structure 250. The system 260 comprises an illumination system that includes the bright field illuminator 12 generating incident light $B^{(b)}_{inc}$ and the dark field illuminator 262 generating incident light $B^{(d)}_{inc}$; an objective lens arrangement 14 for directing the incident light $B^{(b)}_{inc}$ to the wafer W and collecting radiation response $B_{res}$ from the wafer; a beam splitter 20 for separating between the incident light $B^{(b)}_{inc}$ and the collected radiation response $B_{res}$, a beam splitter 22 for splitting the collected radiation $B_{res}$ into two spatially separated radiation components $B^{(1)}_{res}$ and $B^{(2)}_{res}$ propagating through optical channels $C_1$ and $C_2$ of different lengths of the optical paths; the retro-reflector and mirror assemblies 128 and 130, and a pixel array detector (E.g., CCD) 124 defining the imaging plane for acquiring two spaced-apart image parts $B_1$ and $B_2$, each including images of the target structures $T_1$ and $T_2$. In this system, the "main" channel $C_1$ is focused on the PR target structure $T_1$, while the other channel $C_2$ is focused on the metal recesses' target structure $T_2$. As indicated above with reference to FIG. 2B, a field stop 150 is preferably provided in the illumination channel to prevent interference between the light components forming the two images in the same image plane.

It should be noted that the dark field illumination $B^{(d)}_{inc}$ may be in the spectral range different from that of the bright field illumination $B^{(b)}_{inc}$. For example, the bright field illumination may include visible light in the range of 400–700 nm, and the dark field illumination is produced by an LED emitting light of about 780 nm. In this case, a filter $F_1$ (e.g., a low pass filter) is accommodated in the channel $C_1$ in the optical path of light emerging from the retro-reflector and mirror assembly 128, to block the wavelength range of the dark field, and a long pass filter $F_2$ is accommodated in the other channel $C_2$ for allowing the dark field wavelength range to pass therethrough and blocking that of the bright field. The image parts $B_1$ and $B_2$ obtained on the CCD are shifted with respect to each other, wherein the image part $B_1$ is produced by the reflection of the bright field illumination and the image part $B_2$ is produced by scattering components of the dark field illumination, the respective target images being located in their best focus (object plane).

The measurement system of the present invention (either one of the above-described examples) operates in the following manner. The radiation response of the layers $L_1$ and $L_2$ is collected and separated into two radiation components propagating along different channels having different pathlengths towards a common or different imaging planes (common or different detectors). The best focus of the channel $C_1$ is reached by standard microscopic means, e.g., relative displacement between the objective lens arrangement and the sample (wafer) along the Z-axis, preferably by moving the sample. The best focus of the channel $C_2$ is reached by independent movement of the retro-reflector 130 along the Z'-axis. Since the magnification of a microscope is high, typically about 50–100×, even relatively inaccurate movement of the retro-reflector 130 (e.g., with a 10 µm positioning accuracy), would provide a very accurate focusing. Indeed, $_\Delta Z' \approx M^2 \cdot _\Delta Z$. For M=70 and $_\Delta Z'$=10 µm, we have: $_\Delta Z$=2 nm.

The entire focusing range is sufficiently large for using standard optical and mechanical components. For example, for $_\Delta Z$=1 µm, $_\Delta Z'$=5 mm.

It should be understood that the fine focus Z' depends on the specific application, namely a layers' distance h and material of the film stack of the target structure.

The best focus may be predetermined at the stage of recipe design and be included as the parameter of the recipe. Alternatively or additionally, Z' could be automatically adjusted for each measured target.

There are several ways to reach the best focus. The simplest way is to analyze the image itself, e.g., the width of a line edge, and vary the position of the focal plane with respect to the imaged plane (Z and Z') until reaching the best image quality. Another way is to use additional optical means capable of ensuring higher defocus sensitivity than the image itself. One of these techniques utilizes analysis of the image of line arrays (grid) projected on the object plane through the illumination channel. This technique is disclosed in U.S. Pat. No. 5,604,344 assigned to the assignee of the present application.

Figure 3A:
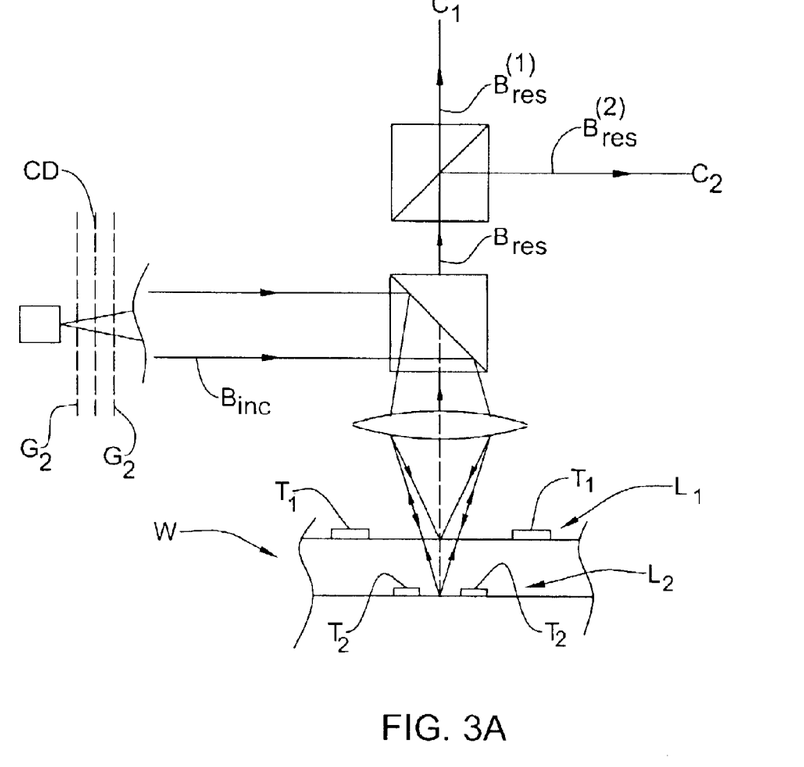
FIGS. 3A and 3B exemplify the auto-focusing technique suitable to be used in the measurement system of the present invention.
Figure 3B:
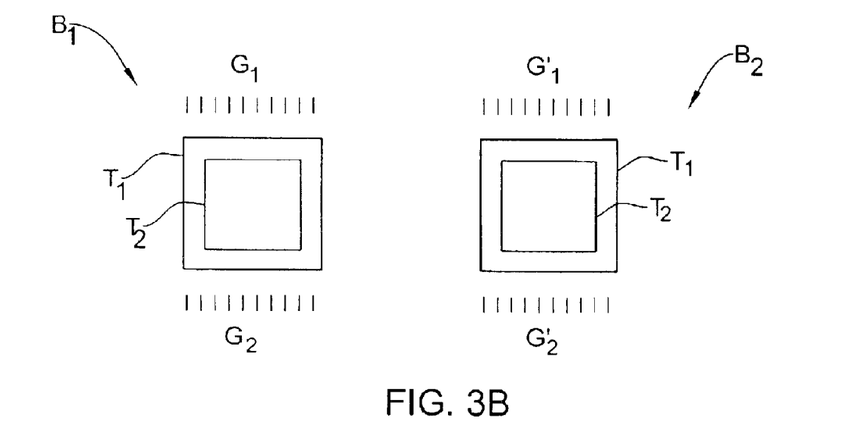

A part of the system according to the invention utilizing the principles of the above technique is schematically illustrated in FIGS. 3A–3B. As shown in FIG. 3A, two spaced-apart parallel grids (line arrays) $G_1$ and $G_2$ are projected onto two spaced-apart planes (layers) in the sample through the objective lens 14, which also collects the radiation response of the illuminated region of the sample. The beam splitter 20 is used for separating between the incident and returned radiation, and the beam splitter 22 separates the returned radiation into two spatially separated components $B^{(1)}_{res}$ and $B^{(2)}_{res}$ propagating along the different channels $C_1$ and $C_2$, respectively A central plane CP between the grids $G_1$ and $G_2$ is a conjugate plane to the object plane (layer $L_1$ or $L_2$). FIG. 3B schematically illustrates the so-obtained image formed by two spaced-apart image parts $B_1$ and $B_2$. The image part $B_1$ includes images of the targets $T_1$ (focused) and $T_2$ and images $G_1$ and $G_2$ of the projection of the grids $G_1$ and $G_2$ onto the $B_1$ structure. The image part $B_2$ includes images of the targets $T_1$ and $T_2$ (focused) and images $G'_1$ and $G'_2$ of the projection of the grids $G_1$ and $G_2$. As described in the above-indicated U.S. Pat. No. 5,604,344, by comparing G' and G'' images, a very accurate focusing for each image. This patent is therefore incorporated herein by reference, with respect to this specific example of the specific feature of the invention. If a field stop 150 is required in conjunction with the grids $G_1$ and $G_2$, then it necessitates that the aperture of the field stop be larger than the lateral size of the grids.

Figure 4A:
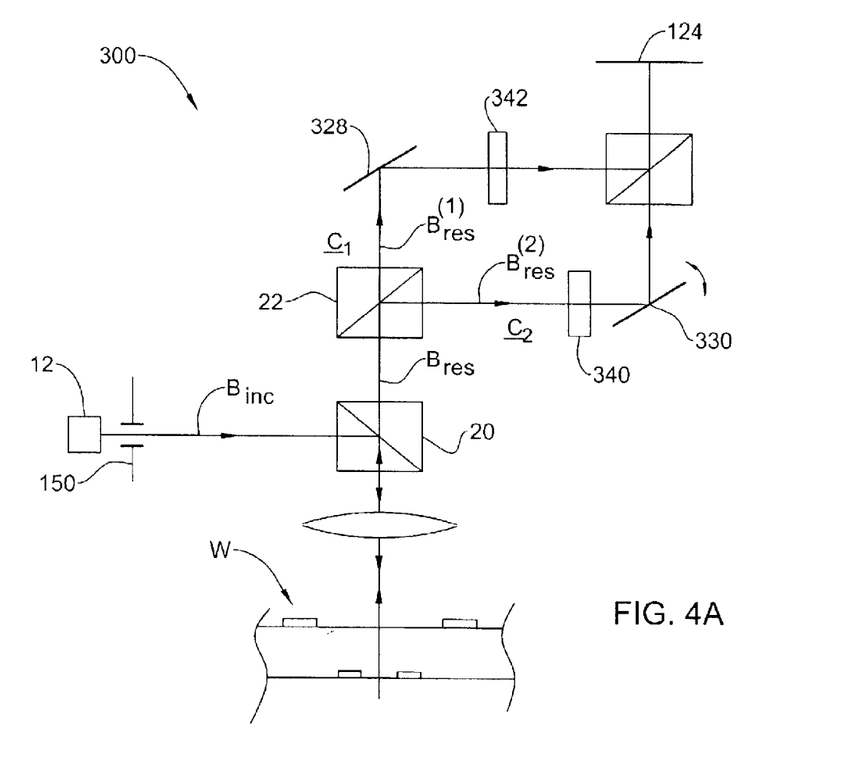
FIG. 4A is a schematic illustration of a part of a measurement system according to yet another example of the invention.

It should be noted that retro-reflectors used in the system of FIG. 2A can be replaced by any other suitable element capable of changing the optical distance between the objective lens 14 and the detector 124, thereby enabling to obtain z'-focusing of the channel $C_2$. FIG. 4A schematically illustrates a part of a measurement system 300 utilizing a single detector 124 for concurrently acquiring two images of the two target structures in spaced-apart layers of the sample. Similar to the previously described examples, the beam splitter 22 splits the collected radiation response into two spatially separated components $B^{(1)}_{res}$ and $B^{(2)}_{res}$ and directs them to the channels $C_1$ and $C_2$. Here, mirrors 328 and 330 are used, wherein the mirror 328 replaces the retro-reflector 128 of FIG. 2A and mirror 330 replaces the retro-reflector 130 and mirror 134 of FIG. 2A. The mirror 330 is mounted for pivotal movement and its angular position can be appropriately aligned. Further provided in the system 300 is a focusing element 340 accommodated in the channel $C_2$ and capable of changing the optical distance of this channel relative to that of the channel $C_1$, and a compensating element 342 accommodated in the channel $C_1$.

Figure 4B:
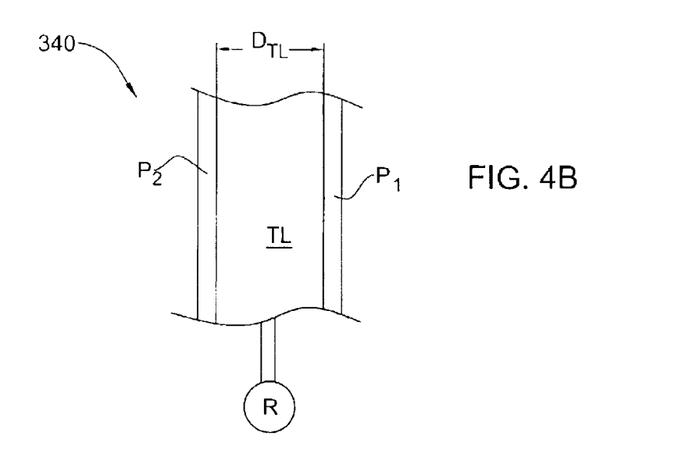
FIG. 4B illustrates a focusing element suitable to be used in the system of FIG. 4A.

As shown in FIG. 4B, the focusing element 340 is composed of two spaced-apart parallel transparent plates $P_1$ and $P_2$ (e.g., made of quartz) and a transparent liquid TL (e.g., glycerin) with a refraction index $n_{TL}$ between the plates. The element 340 is accommodated in the channel $C_2$ such that the radiation component $B^{(2)}_{res}$ sequentially passes the two plates. By moving one plate with respect to the other by a suitable moving assembly (not shown), the thickness $D_{TL}$ of the transparent liquid layer TL can be appropriately changed thereby changing accordingly the optical distance $S_2$: $_\Delta S_2 \approx D_{TL} \cdot (n_{TL}-1)/n_{TL}$. For example, if $D_{TL}=20$ mm, we have: $(_\Delta S_2)_{max} \approx 20 \cdot (1.5-1)/1.5 \approx 7$ mm; and $(_\Delta S_2)_{min} = 2 \cdot (1.5-1) \approx 0$ mm. A reservoir 344 is used to accept the liquid TL while reducing the gap $D_{TL}$ between the plates $P_1$ and $P_2$. The element 342 in the channel $C_1$ serves to compensate for the difference caused by the plates $P_1$ and $P_2$. Such a compensating element may be an optical plate of the thickness equivalent to those of $P_1$ and $P_2$. Comparing the system configurations with retro-reflectors and with the focusing element 340, the latter provides for minimal optical losses and smaller size.

It should be noted that using standard beam splitters, unavoidably results in losses of the radiation intensity while splitting and combining the optical channels (50% losses in beam splitter/combiner). These losses can be reduced by a factor of 2 by using polarizing beam splitters, so that the polarizations of light components in the channels are different (p- and s-polarizations).

In distinction to the state of the art "low numerical aperture" concept, which is the only concept available for integrated metrology, the technique of the present invention allows for operating with a high numerical aperture and compensating for intensity losses of beam splitting and combining. Indeed, using for example a numerical aperture of 0.9 instead of 0.5, gives a factor of $(0.9/0.5)^2 \approx 3.2$, which is higher than the factor of 2, by which the intensity losses can be reduced by using a polarizing beam splitter/combiner.

The following is the description of the calibration procedure suitable to be used in the method of the present invention. The main principles of this procedure are based on the following.

The technique of the present invention utilizes a lateral shift between two images located in different object planes, wherein generally, it may be assumed that this shift is known, is stable in time, and does not change with varying a Z' distance. However, these assumptions might not always be correct in practice: the shift may vary from system to system, may be changeable in time (e.g., due to temperature changes), and may be affected by a mechanical movement during the Z' focusing.

The invention also provides for solving the above problem by using a calibration target having preset accurate values of the lateral shift for different Z' values. Such a calibration target is a part of the measurement system and can be measured each time when desired, for example between lots or between the wafers in a lot, during the lot or wafer load/unload time, when no measurements are applied to wafers.

Figure 5A:
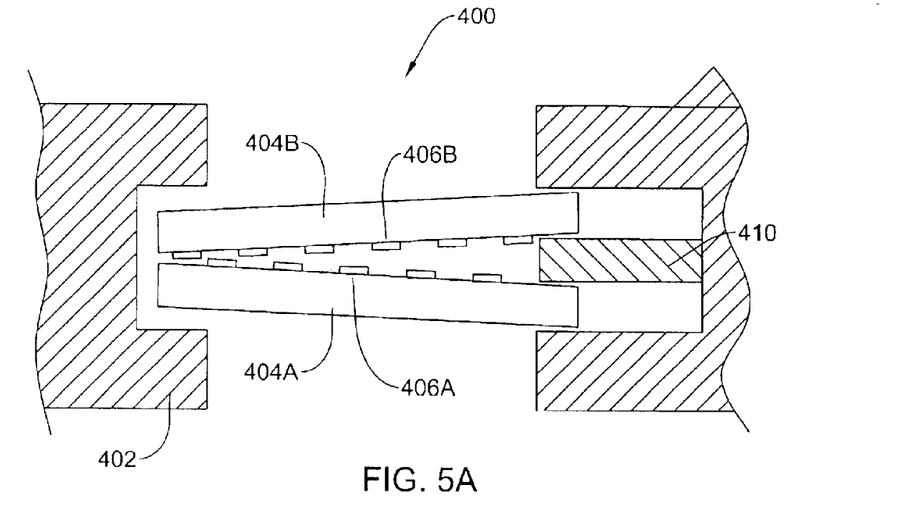
FIGS. 5A and 5B schematically illustrate an example of a calibration target structure suitable to be used in the measurement system of the present invention.
Figure 5B:
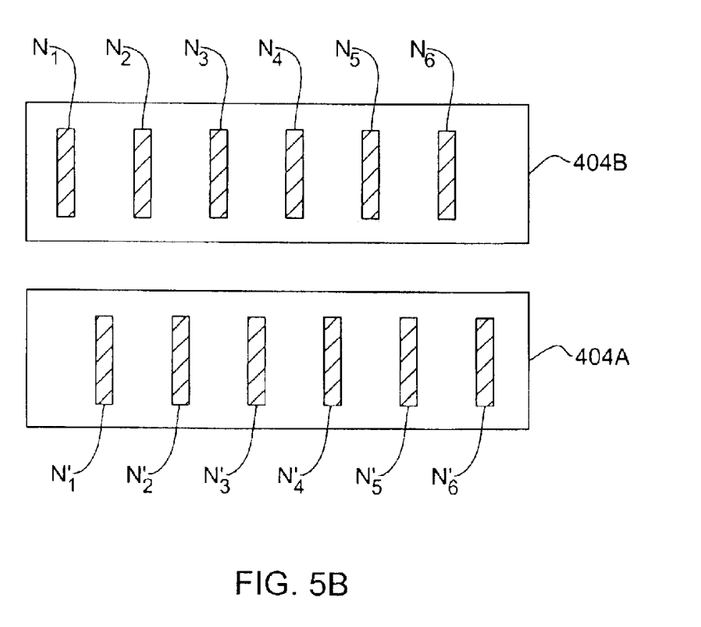

FIG. 5A schematically illustrates an example of a calibration target structure 400. The calibration structure 400 is supported by a holder 402, and is composed of two similar reticles 404A and 404B. The reticles 404A and 404B are made of glass or quartz and have patterned metal layers (e.g., chrome) 406A and 406B, respectively. Chrome-on-glass structures provide for very high contrast images. As better shown in FIG. 5B, the pattern 406A is in the form of spaced-apart parallel chrome lines—six such lines $N_1$–$N_6$ being shown in the present example, and the pattern 406B is formed by similarly spaced chrome lines $N'_1$–$N'_6$.

As further shown in FIG. 5A, the patterns 406A and 406B are shifted with respect to each other along the X-axis. A shim-like element 410 is inserted between the reticles at one edge of the structure 400, resulting in that the distance between each two respective pattern features or lines ($N_1$ and $N'_1$, $N_2$ and $N'_2$, etc.) varies along the X-axis. The 10 $\mu$m thick shim element 410 provides a gap between the two reticles that covers the entire possible range of variations of Z'-focus. Imaging of each pair $N_1$ and $N'_1$, $N_2$ and $N'_2$, etc. simulates imaging of the two layers of the sample with a different gap, i.e., with a different Z' value. It should be noted, that such a calibration target structure shaped like a wedge having two patterned surfaces.

Figure 6A:
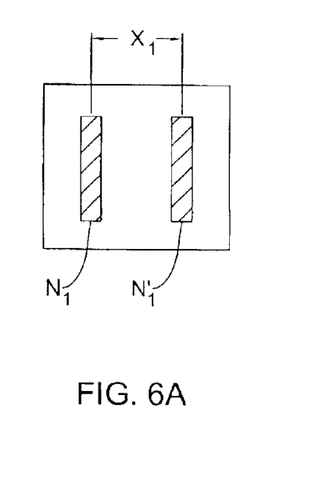
FIGS. 6A and 6B schematically illustrate images of the patterns in the calibration targets of FIG. 5B simulating images of the targets made in the sample to be measured.
Figure 6B:
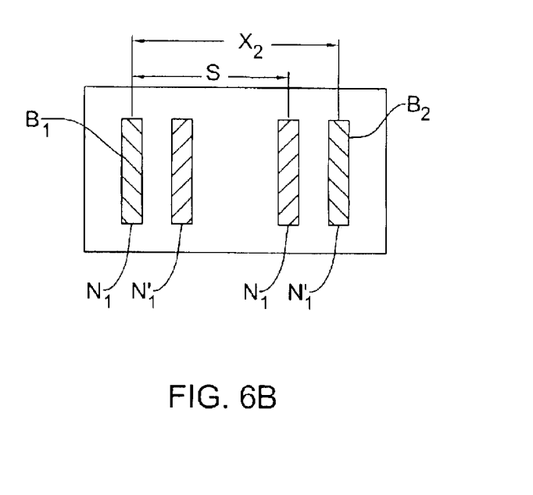

FIGS. 6A and 6B illustrate images of the first part of lines $N_1$ and $N'_1$ of the calibration target obtained with, respectively, a single imaging channel (the prior art technique), and two imaging channels with a single imaging plane (the embodiment of the present invention). As shown in FIG. 6A, with the optimal focus position, the two lines $N_1$ and $N'_1$ are on the main defocus, $x_1$ being the registration between the reticles 404A and 404B (i.e., different layers). In FIG. 6B, two image parts are shown $B_1$ and $B_2$ shifted from each other a distance S, and each including images of the two reticles 404A and 404B, wherein each lines in the pair in the in-focus position are spaced from each other a distance $x_2$. Here, in the image part $B_1$ the reticle 404A is in focus, and in the image part $B_2$ the reticle 404B is in focus. Hence, the registration between the reticles 404A and 404B is equal to $(x_2-S)$.

As indicated above, each pair $N_1$ and $N'_1$, $N_2$ and $N'_2$, etc. simulates imaging of the two layers of the sample with different gaps between the layers along the Z-axis, that is with different Z' values. The Z' difference between the adjacent pairs should be much smaller than the depth of focus of the optical system.

The calibration target, prior to be installed in the measurement system, can be measured on a "golden" system. Such a system is to have a depth of focus (DOF) larger than the maximal usable gap (e.g., 3 μm) between the two reticles. Thus each pair of lines $N_1$ and $N'_1$, $N_2$ and $N'_2$, etc. provides a contrast image on the pixel array of the detector. The system also should be characterized by a high signal-to-noise ratio, e.g., utilize the brightest light source or the pixel array detector with a minimal noise level (e.g., cooled). Alternatively, the golden system may be constructed as the "regular" measurement system (as described above), but operable to carry out several measurements at the same point in order to increase the measurement precision. The golden system characterized by these features enables determination of the distance between the two lines in each pair of the calibration target with much higher accuracy than the regular measurement system as described above.

The accuracy of the golden system is sufficient to measure the distance between the two lines in the pair. The measured value, $x_{cal}=x_1$, of the distance between the two respective lines ($x_1$ and $x_2$ in FIG. 6A) is stored for each individual line pair of the $x^i_{cal}$. A rigid package of the calibration target provides a very high time stability of the calibration target (i.e., of the $x_{cal}$ value).

Thus, the calibration target having been installed in the regular measurement system (e.g., system 10 of FIG. 1), is used for determining the shift S with a required frequency. The calibration value $x_{cal}$ is kept in the system memory (in the control unit 19 in FIG. 1) as one of the internal parameters of the system.

The calibration procedure consists of the following: An additional focus Z' is set in a required position, e.g., according to the recipe of the next coming lot or wafer. The system is operated in the regular measurement mode (shown in FIG. 6B). The distance $x_2$ between the two lines in the pattern pair that is characterized by a Z' gap between them, is closest to the corresponding value in the recipe. Then, the shift value $S^{(i)}$ is measured as $(x^{(i)}_2 - x^{(i)}_{cal})$ for each pair, i being the number of the pair). Thereafter, measurements are applied to the wafer and measured data (output of the detector) is analyzed taking into account the shift value $S^{(i)}$ measured on the calibration target.

Figure 7:
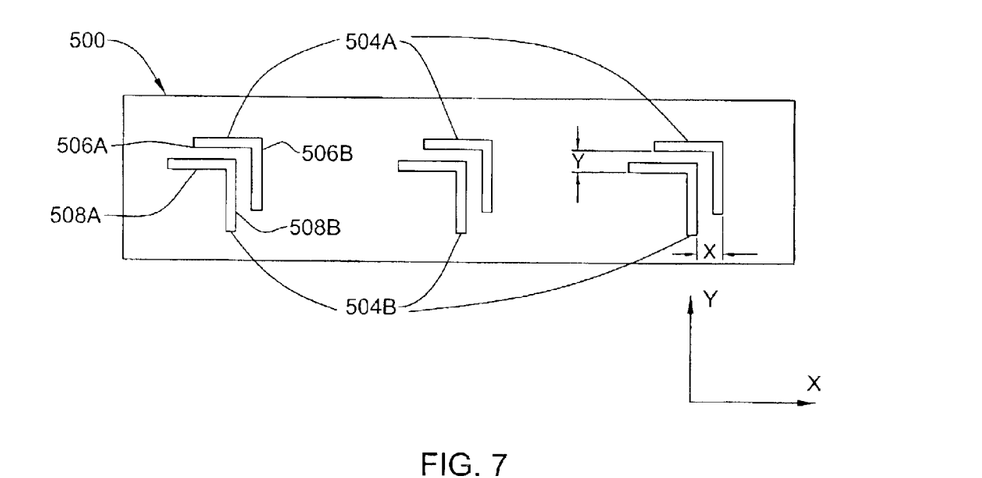
FIG. 7 illustrates an example of a two-dimensional shift calibration target structure suitable to be used in the present invention.

It should be understood that the two-dimensional shift calibration target (along the X- and Y-axes) may also be used with the technique of the present invention. This is schematically illustrated in FIG. 7. In a calibration target 500 of FIG. 7, two-part line patterns 504A and 504B are used instead of the single-part line pattern of the target of FIGS. 5A–5B. The two line parts 506A and 508A (or 506B and 508B) extend along the X- and Y-axes, respectively. The calibration in Y-direction is similar to that of the X-direction described above.

Those skilled in the art will readily appreciate that various modifications and changes can be applied to the embodiments of the invention as hereinbefore exemplified without departing from its scope defined in and by the appended claims.

What is claimed is:

1. A method for imaging two target structures in two parallel layers, respectively, of a sample, the method enabling determination of a registration between the two target structures along two mutually perpendicular axes of the layer, the method comprising:

(a) illuminating the sample with incident radiation to produce a radiation response of the sample to said incident radiation;

(b) collecting the radiation response by an objective lens arrangement;

(c) splitting the collected radiation response into two spatially separated radiation components and directing the split radiation components towards at least one imaging plane along different optical channels characterized by optical paths of different lengths, respectively;

(d) detecting said two split radiation components in said at least one imaging plane, thereby concurrently acquiring two image parts, each containing images of the two target structures, and enabling determination of the relative distance between the two target structures.

2. The method according to claim 1, wherein said different lengths of the optical paths are such that one of the image parts corresponds to a best focus position of one of the target structures, and the other image part corresponds to a best focus position of the other target structure.

3. The method according to claim 1, wherein said illuminating comprises directing a bright field illumination component to the sample through said objective lens arrangement.

4. The method according to claim 3, further comprising spatially separating between the bright field illumination component and said collected radiation response.

5. The method according to claim 4, wherein said spatially separating comprises passing the bright field illumination component towards the objective lens arrangement through a beam splitter accommodated in the path of the collected radiation response.

6. The method according to any one of claim 3, wherein said illuminating further comprises directing a dark field illumination component onto the sample.

7. The method according to claim 6, wherein the bright field and dark field illumination components are of different wavelength ranges, respectively.

8. The method according to claim 1, further comprising carrying out a calibration procedure.

9. The method according to claim 8, wherein said calibration procedure comprises imaging a calibration target structure formed by two patterned layers with a certain shift between the patterns and with a continuously varying distance between the layers along the length of the calibration target.

10. The method according to claim 1, wherein the difference between the lengths of the optical paths is predetermined in accordance with the sample's parameters.

11. The method according to claim 1, comprising adjusting the length of one optical path with respect to the length of the other optical path to provide a required distance between the lengths of the optical paths in accordance with the quality of the acquired images, said required distance being that corresponding to the best image quality.

12. The method according to claim 11, wherein the best image quality is that characterized by the optimal image contrast.

13. The method according to claim 11, wherein the best image quality is that characterized by the optimal image resolution.

14. The method according to claim 1, wherein the splitting of the collected radiation comprises passing the collected radiation through a beam splitter.

15. The method according to claim 14, wherein said beam splitter is a polarizing beam splitter.

16. The method according to claim 14, wherein said beam splitter is a wavelength-selective beam splitter.

17. The method according to claim 1, wherein said two image parts are acquired by the same pixel-array detector defining the imaging plane.

18. The method according to claim 17, wherein the split radiation components are directed to two spaced-apart sensing regions of the pixel-array.

19. The method according to claim 17, wherein the split radiation components are directed to the same sensing region of the pixel array.

20. The method according to claim 1, wherein said two image parts are acquired by two pixel-array detectors, respectively, defining two different imaging planes.

21. A method for overlay measurements in a sample having at least two layers formed with at least two target structures, respectively, the method comprising:
   illuminating the sample with incident radiation to produce a radiation response of the sample to said incident radiation;
   collecting the radiation response by an objective lens arrangement;
   splitting the collected radiation response into two spatially separated radiation components and directing the split radiation components towards at least one imaging plane along different optical channels characterized by optical paths of different lengths, respectively;
   detecting said two split radiation components in said at least one imaging plane, thereby concurrently acquiring two image parts, each containing images of the two target structures, and
   determining the distance between the two target structures.

22. An optical measurement system for imaging two target structures in two different layers, respectively, of a sample, the system comprising:
   an illumination device operable to produce incident radiation for illuminating the sample and thereby producing radiation response of the sample to the incident radiation;
   an objective lens arrangement accommodated so as to collect the radiation response;
   a detection system comprising at least one pixel-array detector defining at least one imaging plane;
   a radiation directing assembly accommodated in the path of the collected radiation response and operable to split the collected radiation response into two spatially separated radiation components and direct the separated radiation components to said at least one imaging plane along two different optical channels characterized by optical paths of different lengths, respectively, thereby enabling to concurrently acquire on said at least one imaging plane two image parts, each comprising images of the two target structures.

23. The system according to claim 22, wherein said different lengths of the optical paths are such that one of the image parts corresponds to an in-focus position of one of the target structures, and the other image part corresponds to an in-focus position of the other target structure.

24. The system according to claim 22, wherein said illumination device comprises a radiation source accommodated to provide a bright field illumination of the sample through said objective lens arrangement.

25. The system according to claim 24, wherein said radiation directing assembly comprises a beam splitting means accommodated in the path of the bright field illumination propagating towards the objective lens arrangement and in the path of the collected radiation response to thereby spatially separate between the bright field illumination and said collected radiation response.

26. The system according to claim 24, wherein said illumination device further comprises directing a radiation source accommodated to provide dark field illumination of the sample.

27. The system according to claim 26, wherein the bright field and dark field illuminations are of different wavelength ranges, respectively.

28. The system according to claim 22, comprising a holder supporting a calibration target structure.

29. The system according to claim 28, wherein said calibration target structure is formed by two patterned layers with a certain shift between the patterns and with a continuously varying distance between the layers.

30. The system according to claim 22, wherein said radiation directing assembly comprises a beam splitting means that splits the collected radiation response into the two spatially separated radiation components, and reflecting elements directing the separated radiation components to the same imaging plane along the two different optical channels.

31. The system according to claim 30, wherein said reflecting elements include a reflecting element mounted for pivotal movement, thereby enabling adjustment of a relative position of one image part with respect to the other in the imaging plane.

32. The system according to claim 30, wherein said radiation directing assembly further comprises a beam combiner means accommodated in the path of the two radiation components propagating towards the imaging plane.

33. The system according to claim 30, wherein said beam splitter mean is a wavelength selective beam splitter.

34. The system according to claim 30, wherein said beam splitter mean is a polarization-based beam splitter.

35. The system according to claim 32, wherein said beam combiner mean is a wavelength selective beam combiner.

36. The system according to claim 32, wherein said beam combiner mean is a polarization-based beam combiner.

37. The system according to claim 30, wherein the reflecting elements include at least one element mounted for reciprocating movement along the respective optical path to thereby adjust the length of this optical path with respect to the length of the other optical path.

38. The system according to claim 37, wherein said movable reflecting element is a retro-reflector.

39. The system according to claim 30, wherein said radiation directing assembly comprises a focusing element accommodated in one of the optical paths and having a variable thickness thereby enabling adjustment of the length of this optical path with respect to the length of the other optical path.

40. The system according to claim 39, wherein said focusing element comprises a container with a liquid thereinside, which is transparent with respect to the collected radiation, the inside of the container being connected to a reservoir for flowing the liquid into an out of the container, thereby varying the size of the container in the path of the radiation component.

41. The system according to claim 39, wherein said radiation directing assembly comprises a compensating element accommodated in the optical path other than that including the focusing element.

42. The system according to claim 22, wherein said radiation directing assembly comprises a beam splitting means that splits the collected radiation response into the two spatially separated radiation components and directs the separated radiation components to two imaging planes, respectively, along the two different optical channels.

43. The system according to claim 22, wherein at least one pixel array detector is accommodated in said at least one imaging plane.

* * * * *